United States Patent
Yurrtas et al.

(10) Patent No.: US 9,831,844 B2
(45) Date of Patent: Nov. 28, 2017

(54) DIGITAL MICROPHONE WITH ADJUSTABLE GAIN CONTROL

(71) Applicant: Knowles Electronics, LLC, Itasca, IL (US)

(72) Inventors: Aziz Yurrtas, København S (DK); Per Flemming Høvesten, Måløv (DK); Svetoslav Gueorguiev, Copenhagen (DK); Claus Erdmann Fürst, Roskilde (DK); Henrik Thomsen, Holte (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/855,557

(22) Filed: Sep. 16, 2015

(65) Prior Publication Data
US 2016/0087596 A1    Mar. 24, 2016

Related U.S. Application Data

(60) Provisional application No. 62/052,684, filed on Sep. 19, 2014.

(51) Int. Cl.
*H03G 3/20* (2006.01)
*H03G 3/30* (2006.01)
(Continued)

(52) U.S. Cl.
CPC ........ *H03G 3/3005* (2013.01); *H03F 3/183* (2013.01); *H04R 1/04* (2013.01)

(58) Field of Classification Search
CPC ........ H03G 3/20; G10L 25/78; H04R 17/02
(Continued)

(56) References Cited

U.S. PATENT DOCUMENTS

| 4,016,557 A | * | 4/1977 | Zitelli | H03M 1/186 330/124 R |
| 5,402,518 A | * | 3/1995 | Lowery | G11B 15/023 704/201 |

(Continued)

FOREIGN PATENT DOCUMENTS

JP    2009200709 A    9/2009

OTHER PUBLICATIONS

International Search Report and Written Opinion for PCT/US2015/050687 dated Dec. 23, 2015 (10 pages).

*Primary Examiner* — Gerald Gauthier
(74) *Attorney, Agent, or Firm* — Foley & Lardner LLP (57) ABSTRACT

Approaches are provided for an apparatus that includes an input buffer, an analog-to-digital converter coupled to the input buffer, a decompress module coupled to the analog to digital converter, and a gain control module coupled to the input buffer and the decompress module. The input buffer has a first adjustable gain and operating in the analog domain. The analog-to-digital converter converts the input analog data received from the input buffer into digital data. The decompress module operates in the digital domain, and is configured to decompress the digital data received from the analog-to-digital converter. The decompress module has a second adjustable gain and produces an output digital signal. The gain control module determines when to compensate for changes in characteristics the input analog data by selectively controlling the first gain of the input buffer in the analog domain and the second gain of the decompress module in the digital domain.

20 Claims, 8 Drawing Sheets

(51) Int. Cl.
*H03F 3/183* (2006.01)
*H04R 1/04* (2006.01)

(58) Field of Classification Search
USPC ...... 329/347; 341/139, 158, 155; 348/229.1; 375/219, 224, 340; 381/111, 122, 107, 381/174, 355, 398, 71.1, 71.11, 71.6, 93, 381/94.1, 98; 455/67.13, 69, 200.1, 455/234.1, 550.1, 522; 704/201, 500; 73/504.12; 324/202; 600/467; 330/254; 343/757; 367/149; 370/286
See application file for complete search history.

(56) References Cited

U.S. PATENT DOCUMENTS

| | | | |
|---|---|---|---|
| 5,627,857 A * | 5/1997 | Wilson | H03F 1/3241 375/219 |
| 5,822,598 A | 10/1998 | Lam | |
| 6,070,140 A | 5/2000 | Tran | |
| 6,154,721 A | 11/2000 | Sonnic | |
| 6,173,161 B1 * | 1/2001 | Gross, Jr. | H04B 7/005 455/310 |
| 6,249,757 B1 | 6/2001 | Cason | |
| 6,397,186 B1 | 5/2002 | Bush et al. | |
| 6,487,178 B1 * | 11/2002 | Romesburg | H04M 9/082 370/286 |
| 6,756,700 B2 | 6/2004 | Zeng | |
| 7,190,038 B2 | 3/2007 | Dehe et al. | |
| 7,415,416 B2 | 8/2008 | Rees | |
| 7,473,572 B2 | 1/2009 | Dehe et al. | |
| 7,522,193 B2 * | 4/2009 | Itani | H04N 5/2352 348/222.1 |
| 7,589,766 B2 * | 9/2009 | Itani | H04N 5/243 348/229.1 |
| 7,663,432 B2 * | 2/2010 | Prandi | H03D 1/22 329/347 |
| 7,774,204 B2 | 8/2010 | Mozer et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 7,957,972 B2 | 6/2011 | Huang et al. | |
| 8,135,148 B2 | 3/2012 | Jin et al. | |
| 8,275,148 B2 | 9/2012 | Li et al. | |
| 8,666,751 B2 | 3/2014 | Murthi et al. | |
| 8,687,823 B2 | 4/2014 | Loeppert et al. | |
| 8,972,252 B2 | 3/2015 | Hung et al. | |
| 8,996,381 B2 | 3/2015 | Mozer et al. | |
| 9,043,211 B2 | 5/2015 | Haiut et al. | |
| 9,059,630 B2 | 6/2015 | Gueorguiev | |
| 9,112,984 B2 | 8/2015 | Sejnoha et al. | |
| 9,478,234 B1 * | 10/2016 | Nandy | G10L 15/30 |
| 2001/0044712 A1 * | 11/2001 | Vainio | G10L 19/18 704/201 |
| 2002/0093881 A1 * | 7/2002 | Kane | G01H 9/00 367/149 |
| 2005/0207605 A1 | 9/2005 | Dehe et al. | |
| 2006/0068719 A1 * | 3/2006 | Hairapetian | H04B 7/0632 455/69 |
| 2006/0068828 A1 * | 3/2006 | Eckl | H04W 52/16 455/522 |
| 2006/0074658 A1 | 4/2006 | Chadha | |
| 2007/0278501 A1 | 12/2007 | MacPherson et al. | |
| 2008/0175425 A1 | 7/2008 | Roberts et al. | |
| 2008/0219474 A1 | 9/2008 | Deruginsky et al. | |
| 2008/0258986 A1 * | 10/2008 | Milbrandt | H01Q 1/12 343/757 |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2008/0310558 A1 * | 12/2008 | Gaikwad | H03D 3/007 375/340 |
| 2008/0310559 A1 * | 12/2008 | Gaikwad | H04L 7/046 375/340 |
| 2009/0001553 A1 | 1/2009 | Pahl et al. | |
| 2009/0064781 A1 * | 3/2009 | Ayazi | G01C 19/5719 73/504.12 |
| 2009/0180655 A1 | 7/2009 | Tien et al. | |
| 2009/0258625 A1 * | 10/2009 | Ling | H04B 17/318 455/234.1 |
| 2009/0316935 A1 * | 12/2009 | Furst | H03F 1/3211 381/111 |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0135508 A1 * | 6/2010 | Wu | H04R 3/00 381/122 |
| 2010/0183181 A1 | 7/2010 | Wang | |
| 2010/0204996 A1 * | 8/2010 | Zeng | H03G 9/025 704/500 |
| 2010/0246877 A1 | 9/2010 | Wang et al. | |
| 2010/0290644 A1 | 11/2010 | Wu et al. | |
| 2010/0303256 A1 * | 12/2010 | Clemow | G10K 11/178 381/94.1 |
| 2010/0310086 A1 * | 12/2010 | Magrath | G10K 11/178 381/71.11 |
| 2010/0322432 A1 * | 12/2010 | Clemow | G10K 11/178 381/71.1 |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2011/0116646 A1 * | 5/2011 | Sander | H04R 1/1083 381/71.6 |
| 2011/0176698 A1 * | 7/2011 | Tanaka | H04R 1/38 381/355 |
| 2012/0069885 A1 * | 3/2012 | Chung | H04W 52/16 375/224 |
| 2012/0232896 A1 | 9/2012 | Taleb et al. | |
| 2012/0252389 A1 * | 10/2012 | Krishnan | H03G 3/3078 455/200.1 |
| 2012/0269363 A1 * | 10/2012 | Suvanto | H04R 1/04 381/107 |
| 2012/0310641 A1 | 12/2012 | Niemisto et al. | |
| 2013/0044898 A1 | 2/2013 | Schultz et al. | |
| 2013/0058506 A1 | 3/2013 | Boor | |
| 2013/0223635 A1 | 8/2013 | Singer et al. | |
| 2013/0271307 A1 * | 10/2013 | Kropfitsch | H03G 3/002 341/158 |
| 2013/0303919 A1 * | 11/2013 | Corl | A61B 8/4494 600/467 |
| 2014/0086433 A1 | 3/2014 | Josefsson | |
| 2014/0122078 A1 | 5/2014 | Joshi et al. | |
| 2014/0140538 A1 | 5/2014 | Kropfitsch et al. | |
| 2014/0163978 A1 | 6/2014 | Basye et al. | |
| 2014/0177113 A1 | 6/2014 | Gueorguiev et al. | |
| 2014/0197887 A1 | 7/2014 | Hovesten et al. | |
| 2014/0244269 A1 | 8/2014 | Tokutake | |
| 2014/0257821 A1 | 9/2014 | Adams et al. | |
| 2014/0274203 A1 | 9/2014 | Ganong et al. | |
| 2014/0294226 A1 * | 10/2014 | Suvanto | H04R 1/04 381/398 |
| 2014/0340252 A1 * | 11/2014 | Shrivastava | H03M 1/12 341/155 |
| 2014/0368269 A1 * | 12/2014 | Yahav | H03G 3/30 330/254 |
| 2015/0023529 A1 * | 1/2015 | Barzen | G01R 27/2605 381/174 |
| 2015/0058001 A1 | 2/2015 | Dai et al. | |
| 2015/0063594 A1 | 3/2015 | Nielsen et al. | |
| 2015/0115936 A1 * | 4/2015 | Pratap | G01R 33/0035 324/202 |
| 2015/0146885 A1 * | 5/2015 | Fitzgerald | H04R 3/005 381/98 |
| 2015/0208165 A1 * | 7/2015 | Volk | H04R 3/005 381/111 |

(56) References Cited

U.S. PATENT DOCUMENTS

| | | | |
|---|---|---|---|
| 2015/0256916 A1 | 9/2015 | Volk et al. | |
| 2016/0087596 A1* | 3/2016 | Yurrtas | H03G 3/20 381/111 |
| 2017/0026759 A1* | 1/2017 | Dai | H04R 17/02 |

* cited by examiner

FIG. 9 ion and accompanying drawings wherein:
FIG. 1 comprises a block diagram of a microphone with automatic gain control according to various embodiments;
FIG. 2 comprises a graph showing aspects of the operation of a gain control circuit according to various embodiments;
FIG. 3 comprises a flow chart of one example of a gain control circuit according to various embodiments;
FIG. 4 comprises a circuit diagram of portions of a microphone with automatic gain control according to various embodiments;
FIG. 5 comprises a circuit diagram of portions of another microphone with automatic gain control according to various embodiments;
FIG. 6 comprises circuit diagrams of portions of a microphone according to various embodiments;
FIG. 7 comprises a circuit diagram of portions of a microphone (including a switching circuit) with automatic gain control according to various embodiments;
FIG. 8 comprises a block diagram of a gain control module according to various embodiments;
FIG. 9 comprises a flow chart of one example the operation of the decision module in the gain control module according to various embodiments;
FIGS. 10A and 10B show two examples of a compressor in a buffer, with 10A showing no attenuation and FIG. 10B showing an example 12 dB attenuation according to various embodiments.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DIGITAL MICROPHONE WITH ADJUSTABLE GAIN CONTROL

CROSS-REFERENCE TO RELATED APPLICATION

This patent claims benefit under 35 U.S.C. §119(e) to U.S. Provisional Application No. 62/052,684 entitled "Digital Microphone With Adjustable Gain Control" filed Sep. 19, 2014, the content of which is incorporated herein by reference in its entirety.

TECHNICAL FIELD

This application relates to digital microphones and, more specifically, to gain control in these devices and methods.

BACKGROUND

Various types of microphones and receivers have been used through the years. In these devices, different electrical components are housed together within a housing or assembly. Other types of acoustic devices may include other types of components. These devices may be used in hearing instruments such as hearing aids, personal audio headsets, or in other electronic devices such as cellular phones and computers.

Some microphones use a Micro-Electro-Mechanical Systems (MEMS) transducer that receives sound energy and converts the sound energy into an electrical signal. These microphones may also use Application Specific Integrated Circuits (ASICs) that take the electrical signal from the MEMS transducer and perform post processing on the signal and/or buffering of the signal for the following circuit stages in a larger electronic environment.

The output of the ASIC can be in analog form or in digital form, and the microphones with an ASIC providing digital output are known as digital microphones. In recent years digital microphones have become increasingly popular in portable electronic equipment and in particular in mobile phones.

At the same time, there is also an increased demand for microphones supporting high Acoustic Overload Point (AOP) levels. Higher sound levels mean higher voltage levels at the MEMS output to ASIC. This increase means that MEMS output voltage level can be higher than the supply voltage level of the ASIC, which will consequently create a dynamic range problem, where the ASIC will not be able to handle such high input voltage levels without clipping the signal at the input. Constant clipping of the signal at the ASIC input is not acceptable in a microphone system, because this will reduce dynamic range (DR) of the microphone.

BRIEF DESCRIPTION OF THE DRAWINGS

For a more complete understanding of the disclosure, reference should be made to the following detailed descrip-

DETAILED DESCRIPTION

While this invention is susceptible of embodiment in many different forms, there is shown in the drawings and will herein be described in detail various preferred embodiments of the invention with the understanding that the present disclosure is to be considered as an exemplification of the principles of the invention and is not intended to limit the broad aspect of the invention to the embodiment illustrated.

Figure 2:
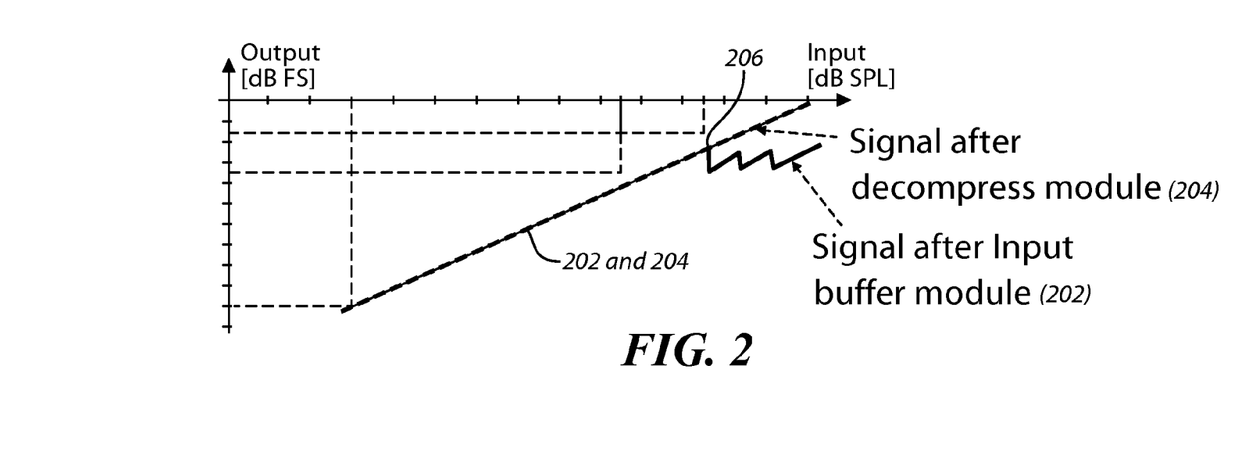

In the approaches described herein, a signal from a microelectromechanical systems (MEMS) device is attenuated at ASIC input and then amplified before it reaches the digital output in a way not degrading microphone dynamic range (DR). Attenuation and then amplification are adaptively performed under the supervision of Automatic Gain Control (AGC) circuit module or modules. The gains of the analog domain and the digital domain are controlled. When one is increased, the other may be decreased. When one is decreased, the other may be increased, in order to maintain a linear input/output characteristic as shown in FIG. 2.

In some aspects, an apparatus that includes an input buffer. The input buffer receives and stores input analog data from a transducer. The input buffer has a first adjustable gain and operates in the analog domain.

The apparatus also includes an analog-to-digital converter coupled to the input buffer. The analog-to-digital converter converts the input analog data received from the input buffer into digital data.

The apparatus also includes a decompress module coupled to the analog to digital converter. The decompress module operates in the digital domain, and is configured to decompress the digital data received from the analog-to-digital converter. The decompress module has a second adjustable gain and produces an output digital signal.

The apparatus also includes a gain control module coupled to the input buffer and the decompress module. The gain control module determines when to compensate for changes in characteristics of the input analog data by selectively controlling the first gain of the input buffer in the analog domain and the second gain of the decompress module in the digital domain.

Figure 1:
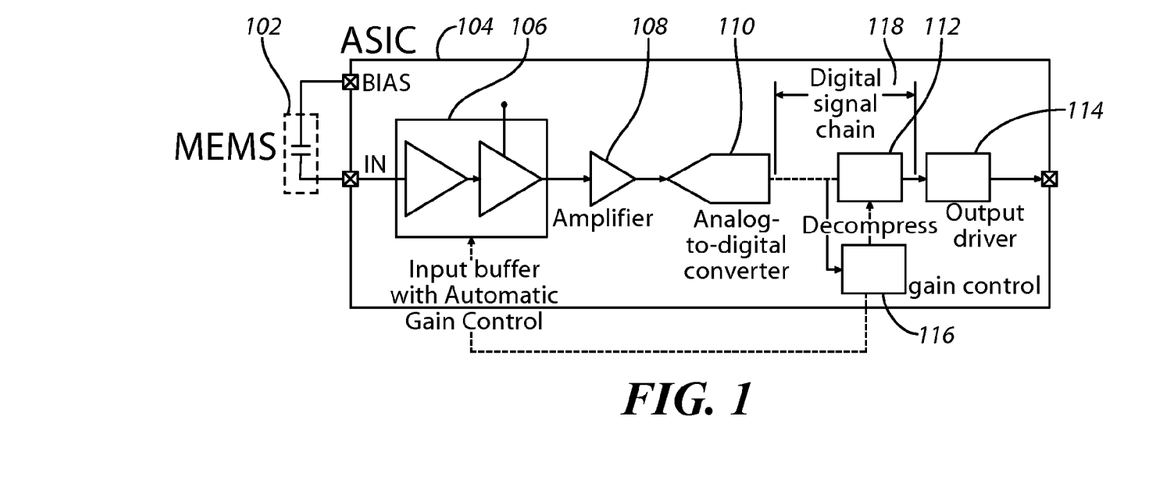

Referring now to FIG. 1, one example of an apparatus for controlling the gains in the analog domain and the digital domain is described. A MEMS device 102 is coupled to an application specific integrated circuit (ASIC) 104. The ASIC 104 includes an input buffer 106 (with automatic gain control), an amplifier 108, an analog to digital converter (ADC) 110, a decompress module 112, an output driver circuit 114, and a gain control module 116. In some aspects, the input buffer 106 may be a pre-amplifier.

The MEMS device 102 includes a diaphragm and a back plate. Sound energy moves the diaphragm and displacement relative to the back plate creates an electrical signal. The ASIC 104 can be any type of integrated circuit that performs a wide variety of processing functions. In one example, the ASIC 104 performs amplification functions, filtering functions, and phase shifting functions. Other examples of functions may also be performed.

The input buffer (or pre-amplifier) 106 performs an impedance transformation on the received signals. The amplifier 108 is used to amplify the signals.

The analog-to-digital converter (ADC) 110 converts analog signals into digital signals. The decompress module 112 is used to provide filtering functionality to the system or otherwise decompress the signal.

The output driver circuit 114 is used to drive external circuitry. The gain control module 116 controls the gain of the input buffer 106 and the decompress module 112.

In one example of the operation of the system of FIG. 1, electrical signals produced at the MEMS device 102 are fed to the ASIC 104. Signals are first buffered by the input buffer 106, and then may optionally be amplified by the amplifier 108 to reduce the noise requirements of the ADC 110. ADC 110 converts the analog signal into a digital signal. A digital signal chain 118 may include any number of decompress modules. Signals are transmitted and pass through the digital signal chain 118 before driven out, at the output driver circuit 114.

In an aspect, the present approaches consider the signal attenuation at the input buffer 106 and then amplification at the digital domain based on the amplitude level of the signal from MEMS device 102.

The gain control module 116 determines when to apply gain change at the analog domain and at the digital domain. The decompress module 112 compensates for the gain changes in the analog domain. A DSP block or module including the decompress module 112 and the gain control module 116 may also be used.

Identification of signal peak level occurs in the digital domain, thereby changing the digital domain gain to compensate for analog gain change. Furthermore, algorithms are provided and utilized in the digital domain to compensate for unwanted effects introduced by analog AGC implementation in the input buffer 106. These unwanted effects include offset, and voltage jumps due to gain changes in the input buffer 106. Other examples are possible.

Using the present approaches, digital microphones can handle and process signals with high sound pressure levels. Additionally, full dynamic range is preserved by adaptively changing the analog and digital domain gain under the supervision of a gain control algorithm. Furthermore, unwanted effects occurred due to analog implementation are compensated by the algorithm(s) in the digital domain.

Referring now to FIG. 2, the signal amplitude at the output of the Input buffer and decompress modules is described. As shown, a first signal 202 represents the signal at the output of the input buffer (e.g., input buffer 106 of FIG. 1). A second signal 204 indicates the signal after being processed by the decompress module 112. At point 206, the digital domain signal gain begins to be changed to compensate for analog gain change. In other words, a gain control module (e.g., gain control module 116) begins to compensate as described elsewhere herein.

It can also be seen in this figure that the overall signal provided at the output of the decompress module is linear or approximately linear. In other words, the full dynamic output range of the microphone is preserved. Consequently, beneficial microphone operation is provided and obtained over a large range of signals.

Figure 3:
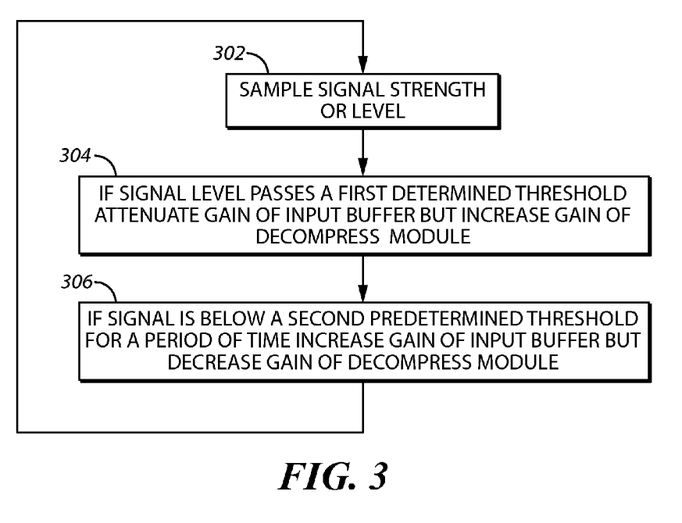

Referring now to FIG. 3, one example of how a gain control circuit can be implemented is described. In one aspect, the steps indicated as being performed according to the approach of FIG. 3 may be performed at the circuit of FIG. 1 or some similar circuit. In another aspect, the approach of FIG. 3 is executed as a continuous loop.

At step 302, the strength or level of the signal is sampled and a determination is made as to whether the strength is increasing, decreasing, has passed certain thresholds, or has passed certain thresholds for certain periods of time. This determination may be made according to a suitable hardware circuit and/or software approach known to those skilled in the art. In one approach, the gain control module 116 may be used to perform these functions.

At step 304 and when the determination indicates a signal with a signal strength that has passed a first pre-determined threshold (e.g., is increasing), the gain of the input buffer (e.g., the input buffer 106) is attenuated, but the gain of the decompress module (e.g., decompress module 112) is increased. This action helps the operating point of the circuit. Since the gain of the input buffer (e.g., the input buffer 106) is adjusted, the digital microphone that can handle signals with high sound pressure levels (SPLs). Additionally, the full dynamic range of the signal is preserved. Further, unwanted effects that occurred due to or in the analog domain are compensated for in the digital domain thereby negating these effects.

At step 306, if the determination indicates a signal which has a signal strength that passes below a second predetermined threshold for a predetermined period of time (e.g., a decreasing strength), the gain of the input buffer (e.g., the input buffer 106) is increased, but the gain of the decompress module (e.g., decompress module 112) is decreased. As before, this action helps the operating point of the circuit.

Figure 4:
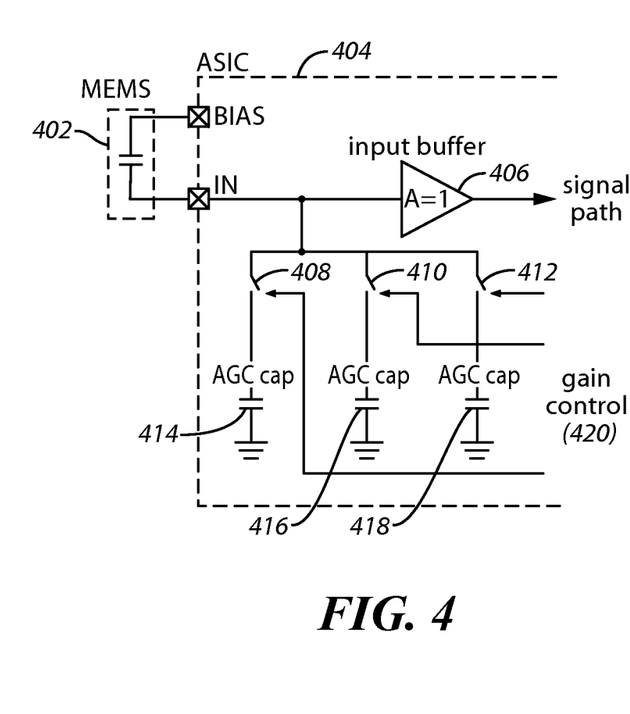

Referring now to FIG. 4, one example of providing signal attenuation is described. A MEMS device 402 is coupled to an ASIC 404. The ASIC 404 includes an input buffer 406. Three switches 408, 410, and 412 switch in and out of the circuit three capacitors 414, 416, and 418. The switches 408, 410, and 412 are controlled by gain control signal 420. In one example, the gain control signal 420 is produced according to the algorithm of FIG. 3. It will be appreciated that FIG. 4 shows only a part of the circuit of FIG. 1 for purposes of simplicity.

By using the capacitive voltage division circuit having capacitors 414, 416, and 418, the input signal to the input buffer 406 is attenuated such that it can be guaranteed that the input signal will never exceed what the circuit in the analog signal domain can handle. The gain control signals received from the digital signal domain, where input signal amplitude is measured at the digital domain by use of a digital circuit instead of analog amplitude detection. Various ones of the capacitors 414, 416, and 418 are switched in and out of the circuit depending upon the amount of attenuation that is needed.

Figure 5:
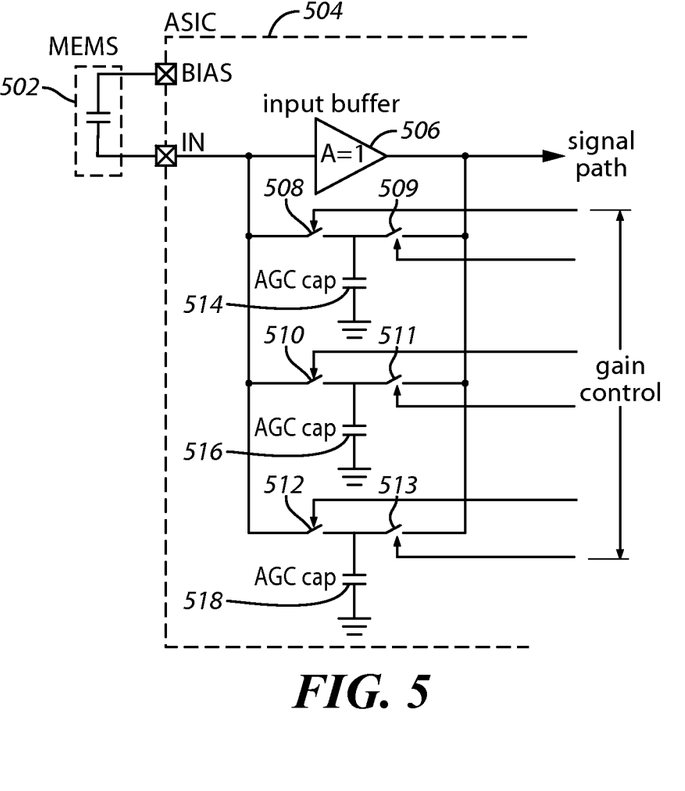

Referring now to FIG. 5, one example of providing signal attenuation is described. A MEMS device 502 is coupled to an ASIC 504. The ASIC 504 includes an input buffer 506. Six switches 508, 509, 510, 511, 512, and 513 switch in and out of the circuit three capacitors 514, 516, and 518. The switches 508, 509, 510, 511, 512, and 513 are controlled by gain control signal 520. In one example, the gain control signal 520 is produced according to the algorithm of FIG. 3. It will be appreciated that FIG. 5 shows only a part of the circuit of FIG. 1 for purposes of simplicity.

The capacitors 514, 516, and 518 are always pre-charged to a voltage level equal to the voltage level at the input of the ASIC labeled IN. This ensures that no voltage jumps due to charge redistribution occur at IN. Various ones of the capacitors 514, 516, and 518 are switched in and out of the circuit depending upon the amount of attenuation that is needed.

Figure 6:
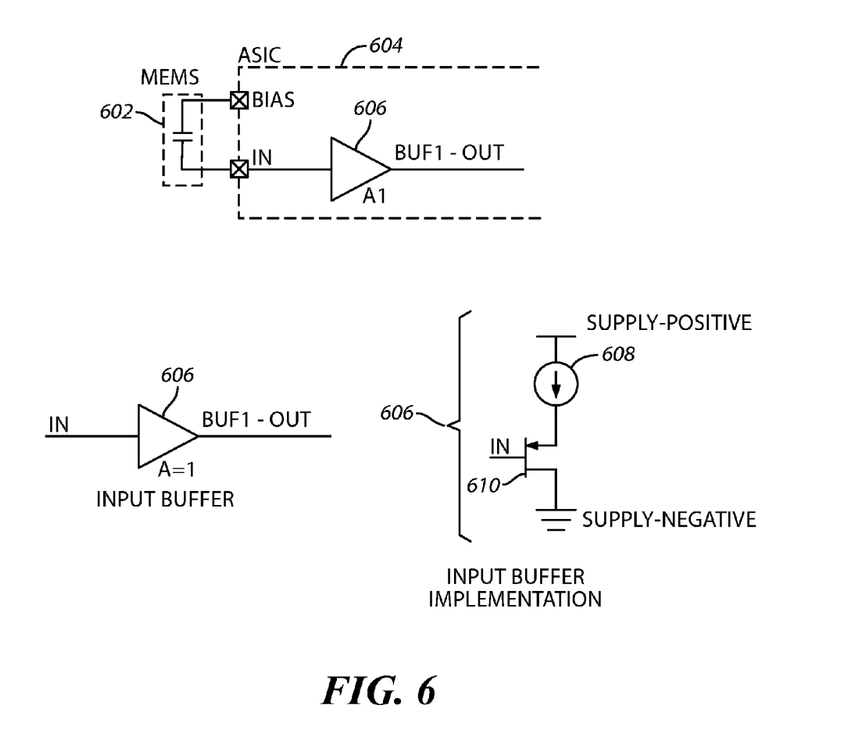

Referring now to FIG. 6, one example of the implementation of an input buffer circuit is described. A MEMS device 602 is coupled to an ASIC 604. The ASIC 604 includes an input buffer 606. The input buffer 606 includes a current source 608 and a transistor 610.

The transistor 610 may have a common-drain PMOS transistor configuration that is biased by the current source 608. The output AC voltage in this circuit will follow the input AC voltage (received at IN), and the DC level of the output voltage is defined by the input voltage plus the gate-source voltage of the PMOS transistor 610. The gate-source voltage of the PMOS transistor 610 is defined by the transistor's dimensions and the bias current from the current source 608.

Figure 7:
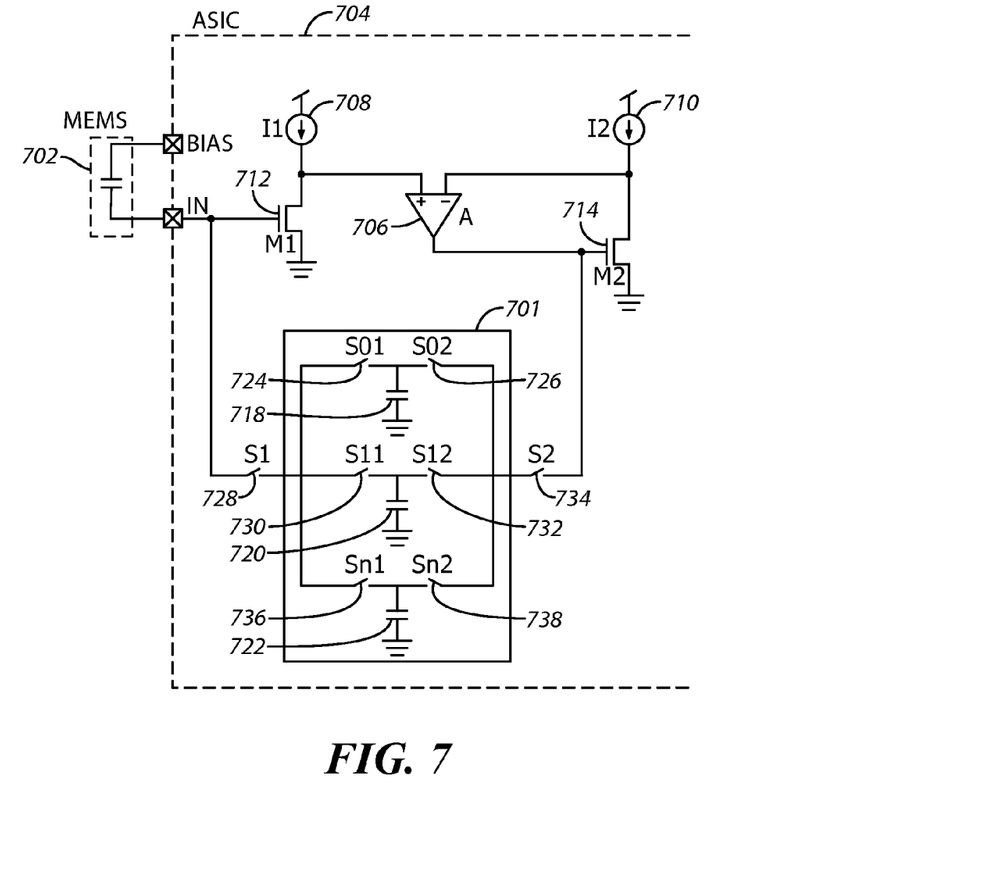

As the output DC voltage level of the input buffer of FIG. 6 is not at the same level as the input DC voltage level, the switching apparatus of FIG. 5 is not used with the circuit of FIG. 6 in some examples. Referring now to FIG. 7, an example of an input buffer is described where signal attenuation at the input of the ASIC is performed by a capacitive voltage division network and the capacitors in the network are pre-charged to the same voltage level of the input to the ASIC.

A MEMS device 702 is coupled to an ASIC 704. The ASIC 704 includes an amplifier 706. The input buffer is coupled to a first current source 708 (I1), a second current source 710 (I2), a first transistor (M1) 712, and a second transistor 714 (M2). A capacitive voltage division network 716 includes capacitors 718, 720, 722, and switches 724 (S01), 726 (S02), 728 (51), 730 (S11), 732 (S12), 734 (S2), 736 (Sn1), and 738 (Sn2).

In operation, the transistor 712 (M1) provides a unity gain buffer stage for the circuit. In order to pre-charge the capacitors 718, 720, 722 to the voltage level of IN, the transistor 714 (M2), which is a mirror common-drain PMOS transistor, is used. Transistor 714 (M2) and the bias current source (the current source 710 (I2)) are scaled versions of transistor 712 (M1) and the current source 708 (I1) respectively. This scaled part of the circuit is referred to as a mirror buffer.

The gate voltage of transistor 714 (M2) is created through a feedback circuit with an amplifier that takes the source terminals of transistor 712 (M1) and transistor 714 (M2) as its inputs. If source terminal voltage level of the transistor 714 (M2) is higher/lower than the source terminal voltage level of transistor 712 (M1), then the output of input amplifier 706 decreases/increases until it is at the same voltage level as the source terminal voltage level of transistor 712 (M1). As the current sources and transistors are matching, then the gate voltage level of transistor 714 (M2) matches the gate voltage level of transistor 712 (M1). In this way, a voltage level is created that is equal to the voltage level of IN. This along with appropriate setting of the various switches is used to pre-charge the capacitors to the voltage level of IN. In this way, gain in the analog signal domain portion of the circuit is adjusted under the control of the digital signal domain of the circuit.

When one of the capacitors 718, 720, and 722 is connected to IN, there will be a voltage jump due to the mismatch between input buffer and mirror buffer together with the offset of amplifier 706. Due to the nature of the construction, this voltage jump is constant and therefore only creates a DC offset. DC offset can be kept at a minimum by an appropriate circuit design or can be removed digitally in the digital signal domain.

As the gain attenuation is dependent on the ratio between the MEMS capacitance and the capacitance at IN, trimming of capacitors 718, 720, and 722 can be done during microphone production tests to match the gain from one microphone to another.

The operation of the various switches as controlled by a gain control signal is now described. In one example, the gain control signal is produced according to the algorithm of FIG. 3. Various ones of the capacitors 718, 720, and 722 are switched in and out of the circuit depending upon the amount of attenuation that is needed and when the capacitors 718, 720, and 722 are pre-charged.

Switching circuit 701 includes switches 724, 726, 730, 732, 736, and 738, and capacitors 718, 720, and 722. Switches 728 and 734 are used to selectively connect or disconnect the switching circuit 701 from the other circuitry on the ASIC.

In one example, to pre-charge the capacitors 718, 720, and 722, the switches 724, 730, 736 are opened and the switches 726, 732 and 738 are closed.

To provide attenuation by connecting one capacitor, e.g., capacitor 718, switch 726 is opened, switches 730 and 736 are opened, and switches 724, 732, and 738 are closed.

To provide more or less attenuation, some or all of the capacitors 718, 720 or 722 are connected to form a capacitive circuit. This can be accomplished in the same way as connecting the capacitor 718, that is, by selectively controlling the switches 724, 726, 730, 732, 736 and 738.

The capacitors 718, 720 or 722 can be same value, scaled by a linear ratio, logarithmic ratio or in a way that fulfill the desired attenuation function.

It will be appreciated that the above approaches result in the gains in analog and digital domains being inversely controlled. That is, when the gain is decreased in the analog domain, it may be increased in the digital domain. When the gain is increased in the analog domain, it may be decreased in the digital domain. The analog and digital domain may be represented (for example, as shown in FIG. 1) separate circuits that are coupled together in the form of an integrated circuit.

One example of the operation of a decompress module (e.g., decompress module 112) is now described. In one aspect, compressed signals traverse from the buffer through a AMPI gain and High Pass filter (e.g., cutoff frequency (Fcut)=6-8 Hz), Antialiasing Filter (e.g., Resistor/Capacitor type), ADC (e.g., 3rd order Sigma Delta), Sinc Filter (e.g., 4th order without decimation), low pass filter, and DC subtraction block (e.g., AMPI/ADC offset) before reaching the decompress module. All these blocks add delay, DC offset, gain mismatch, and/or noise to the compressed signal. For example, noise will be modulated on the output during a gain select change and therefore it needs to be dealt with either by proper gain switching control, keeping the noise in the analog block low or having a small step size.

In one example, the decompress module performs at each clock step n:

```
d(n) = x_d(n) - x_d(n-8)
if Sel(n) != Sel(n-1)
    if Sel(n) < Sel(n-1)
        Pred(n) = x_d(n) + Δclk_rel × d(n)
    Else
        Pred(n) = x_d(n) + Δclk_atc × d(n)
    end
    Δch = { 2^Sel(n) - 2^Sel(n-1) } × Pred(n)
    ch(n-1) = ch(n-1) + Δch
End
ch( n ) = { 1 -- ch_coeff } × ch( n-8)
y_d = 2^Sel × x_d(n) + ch(n)
```

The inputs and outputs of this logic are:

Sel(n) is updated at each clock cycle in one aspect. In aspects, sel(n) has four values (0, 1, 2, 3) corresponding to the number of AGC capacitors included in the circuit at either the buffer (compressor) or decompress module. The values 0, 1, 2, and 3 in this example correspond to or produce 0, 6, 12, and 18 dB gains ($y_d$) respectively. Other examples are possible. Thus, sel(n) yields a magnitude of an output change. The sign or direction of the change depends on whether sel(n) is applied to the decompress module (where the sign is positive and this results in an expansion) or the buffer (or compressor) where the sign is negative and results in an attenuation or lower output.

$x_d(n)$: is the compressed digitized input signal at Fclk ch_coeff: is the decaying charge offset coefficients. This coefficient is programmable and called "charge_dc_coeff" in a memory (e.g., ASIC memory map) that is used for storage. It decides how fast or slow each instantaneous DC change is removed from the signal.

Δclk_rel, Δclk_atc is a 1st order predictor coefficient used to predict sample value offset from each sample time instance n. It is programmable and called "delta_clk_rel/delta_clk_atc" in the ASIC memory map. These are trimmed during wafer delay calibration.

$Y_d$: This is the decompressed output, and in one aspect only calculated at Fclk/8.

Intermediate variables in the decompress module include:

d(n): The differential coefficients calculated at Fclk/8

Pred(n): The predicted sample at (n+Δclk).

ch(n): This is the charge offset estimation that sets the DC level. It tracks the DC level on the IN node and is calculated at the Fclk/8 rate.

Δch: The change in charge offset during a gain switch.

The decompress module is in one aspect forced to select a different gain than decided by the gain control block, i.e., the Sel(n) signal, by writing to "force_exp_sel" in the ASIC memory map. This register should be used when trimming the AGC capacitors in combination with the "force_agc_sel" value.

It will be appreciated that the decompress module as well as the other modules or elements can be implemented in any combination of computer hardware and/or software. For instance, the functions can be implemented as computer instructions running on a processing device.

Figure 8:
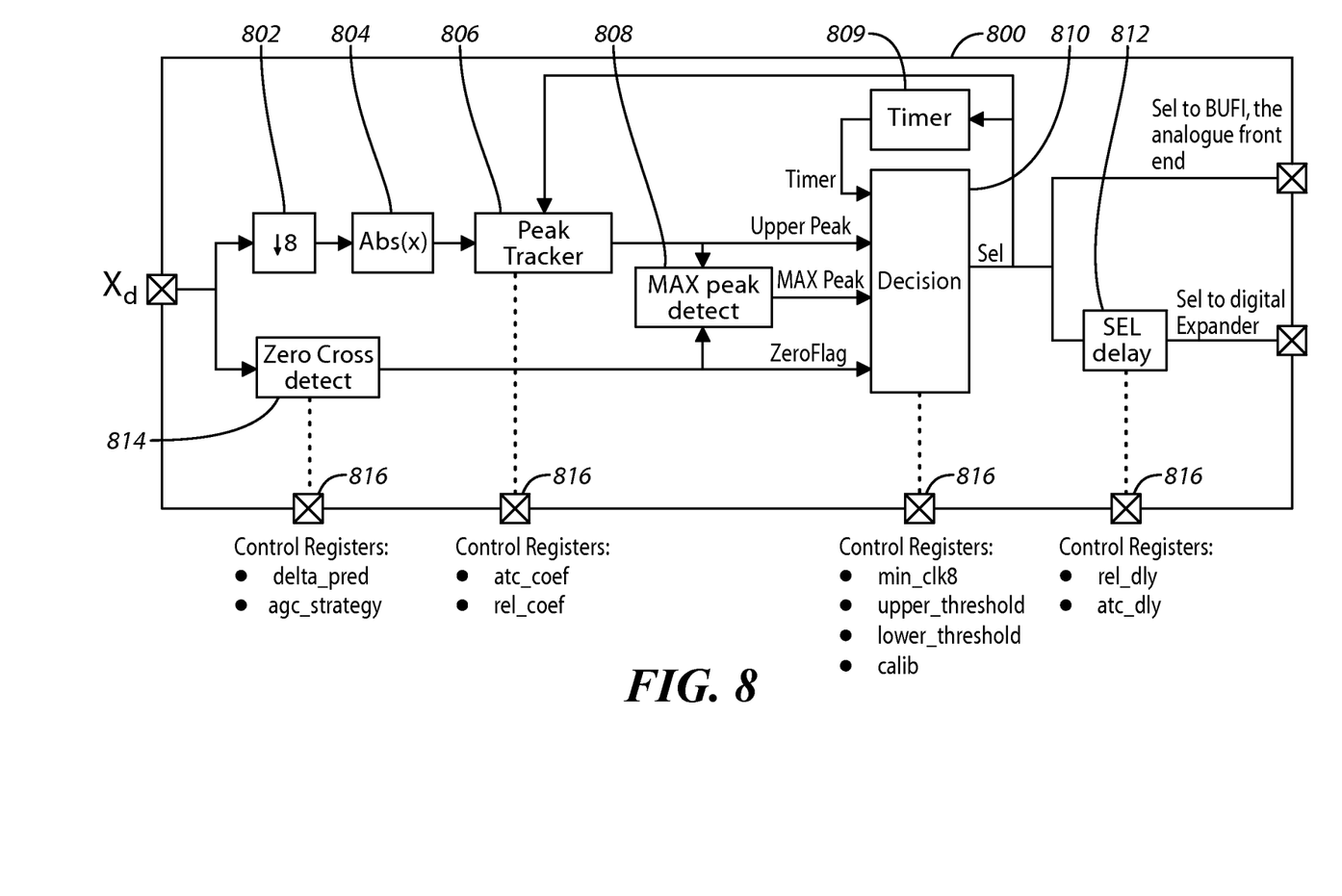

As mentioned, the gain control module controls the attenuation of both the buffer and the decompress module. Referring now to FIG. 8, one example of a gain control module 800 is described. The gain control module 800 includes a decimator 802, an absolute value obtainer module 804, a peak tracker 806, a maximum peak detect module 808, a timer 809, a decision module 810, a select (SEL) delay module 812, and a zero cross detect module 814. As shown, various nodes 816 connect to registers in an ASIC memory map that store various values that are shown and are used by the device 800.

The decimator 802 decimates the incoming samples after SINC filter/calibration with a factor, e.g., a factor of 8. This means that the sample rate is Fclk/8, where Fclk is the clock frequency being used. The absolute value obtainer module 704 takes the absolute value of the decimated signal at, for example, Fclk/8.

The peak tracker 806 follows the peaks in the signals. This is done in one aspect with a 1st order filter with two different coefficients. One coefficient is used for fast tracking when the signals start to increase, the attack coefficient (atc_coef). And the other coefficient is used when signal is decreasing, the release coefficient (rel_coef). These two filter coefficients set the attack and release time for the gain switching. Both the attack and release coefficients are programmable.

The peak tracker 806 implements the following steps and logic for each input $X_{abs}$ at, for example, Fclk/8 to make an estimate of $upper_{peak}(n)$ (where n is the time variable, e.g., in terms of clock periods/8).

```
if X_abs(n) > upper_peak(n)
    upper_peak(n) = {1 - atc_coef} × upper_peak + X_abs(n) × atc_coef
else
    upper_peak(n) = {1 - rel_coef} × upper_peak + X_abs(n) × rel_coef
end
If Sel(n) > Sel(n-1)
    upper_peak(n) = upper_peak(n) / 2
If Sel(n) < Sel(n-1)
    upper_peak(n) = upper_peak(n) × 2
```

$Upper_{peak}(n)$ is the estimate of the peak at, for example, Fclk/8. It will be understood that Sel(n) interpolated to be valid for full 8 clock periods.

The Zero Cross Detect module 814 has an output that in one aspect is a flag indicating when the input signal has changed polarity (a zero cross or crossing). Optionally and when the differential of the signal has changed polarity, this feature is enabled by setting a flag agc_strategy.

The following steps and logic are performed for each $X_d$ input sample, for example, at Fclk/8:

```
d(n) = x_d(n) - x_d(n-1)
X_pred(n) = x_d(n) + Δpred × d(n)
ZeroFlag(n) = 0
If X_pred(n) > 0 AND X_pred(n-1) < 0
    ZeroFlag(n) = 1
If X_pred(n) < 0 AND X_pred(n-1) > 0
    ZeroFlag(n) = 1
```

Here, ZeroFlag(n) is the output indicating a zero crossing and Δpred is a programmable constant. This constant defines how many Fclk/8 cycles the zero crossing event should be predicted, i.e., when the default value of 2.5 is used it compensates for the 20 clock cycle delay in the digital filter and pre-processing in the preceding steps.

The Max Peak Detect module 808 finds the maximum value of the Peak detector output between two zero crossings using the following logic for each input $X_{abs}$ at, for example, Fclk/8 to make an estimate of MaxPeak(n):

```
if upper_peak(n) > MaxPeak(n−1)
    MaxPeak(n) = upper_peak(n)
end
If ZeroFlag(n) == True
    MaxPeak(n)=0
```

MaxPeak(n) is the estimate of the largest peak within two zero cross at Fclk/8. ZeroFlag(n) is "interpolated" to be valid for a full 8 clock periods in this example (simple sample hold). Instantaneous values of MaxPeak and UpperPeak are readable.

The timer 809 counts the number of Fclk/8 after each gain change (an attack or release). And, the timer 809 is used to prevent gain changes just after an attack/release. The timer 809 outputs a flag that indicates if an attack/release is allowed. Attack/release is only allowed when this flag is true. In this way, minimum periods between each attack/release are assured. The minimum time is set by the programmable variable (min_clk8) in one example. Setting min_clk8 to 0 will force the apparatus 800 to have minimum of, for example, 2048*8 clock periods between each attack/release. This is advantageous when calibrating attack and release delay. As used herein, "attack" refers to an input signal going from a low signal level to a high signal level (e.g., by crossing a threshold). As used herein a "release" refers to an input signal going from a high signal level to a low signal level (e.g., by crossing a threshold).

The decision module 810 makes the decision when the input buffer is attacking/releasing or switching in/out the capacitors. The same Sel(n) control signal is sent to the decompress module (digital expander). The gain select decision is made every clock cycle. As mentioned, sel(n) is in one example 4 values and these four values correspond to the number of AGC capacitors switched into the circuit. Each sel(n) value thereby produces a predetermined gain or attenuation depending upon whether it is applied to the buffer or the decompress module.

The gain control switching is only done at a zero crossing, that is, when ZeroFlag(n) is true.

In one aspect, a "Calib" register value is used to set the apparatus into a calibration mode where gain switching is forced.

In another aspect and when max_peak exceeds "upper_threshold", then an attack is made (Sel=Sel+1) else if upper_peak is less than lower_threshold then a release is made (Sel=Sel−1). Both "upper_threshold" and "lower_threshold" are programmable.

The sel delay module 812 delays the gain change to the decompress module. This is to cope with the delay that exists in the signal path from the output of the control signal to the buffer to the input to the decompress module. The delay parameter are in clock cycles. In one aspect, two delay parameters (called "atc_del" and "rel_del") are used as parameter input to this element. In another aspect, any non integer clock delay is compensated by using the "delta_clk_atc" and "delta_clk_rel" in the decompress module as described elsewhere herein.

Figure 9:
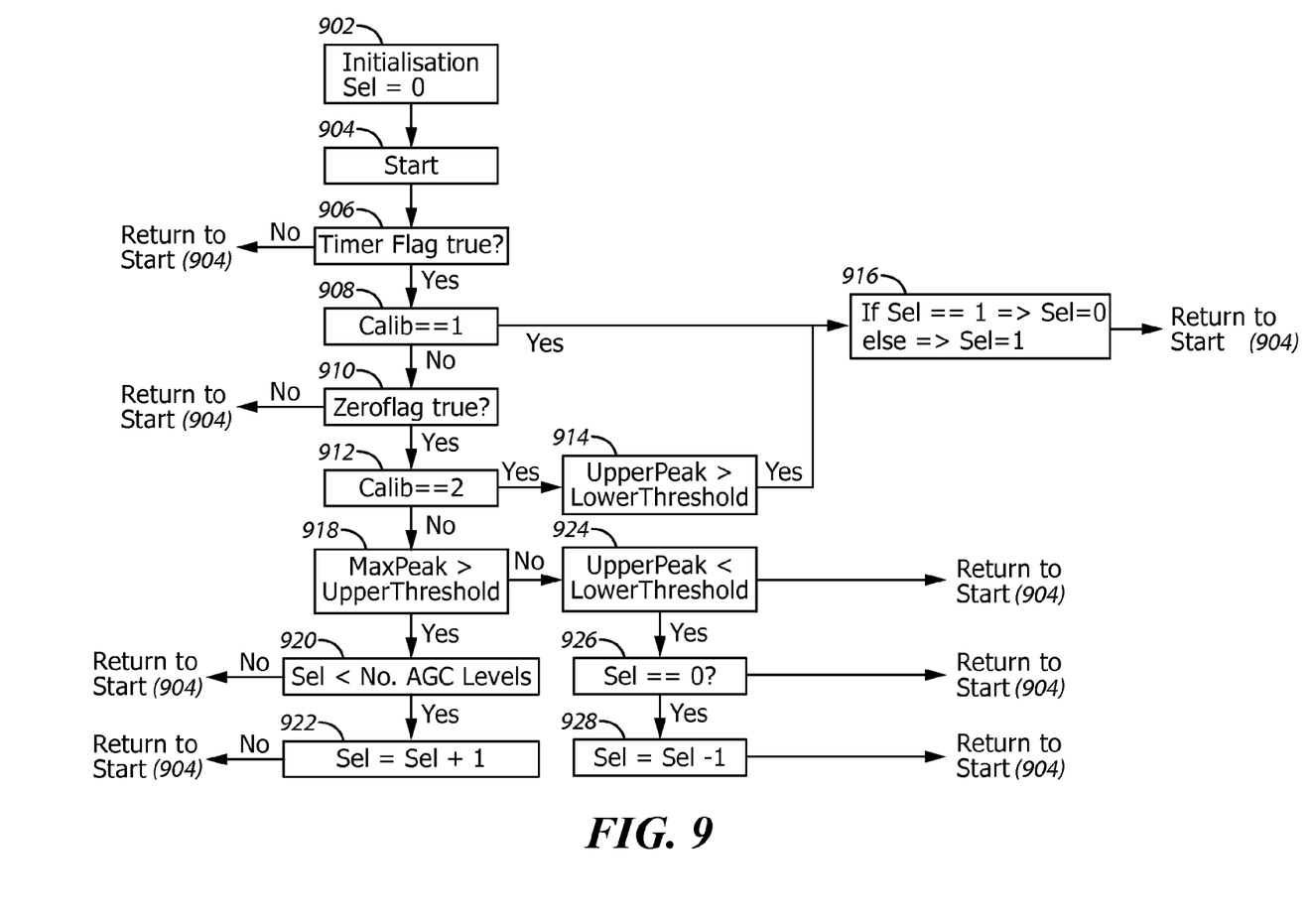

Referring now to FIG. 9, a more detailed description of the operation of the decision module 810 is described. A decision as to whether to increase or decrease gain is made based on the input: ZeroFlag, upper_peak, max_peak and TimerFlag.

At step 902, initialization occurs and Sel=0.

At step 904, start occurs. At step 906, it is determined whether timer flag is true. If the answer is negative, control returns to step 904. If the answer is affirmative, at step 908 it is determined if calib=1 (calibration requested). If the answer is affirmative, control continues at step 916.

At step 916, if sel=1, then sel is set to 0, else sel is set to 1 and execution returns to step 904.

If the answer at step 908 is negative (no calibration), it is determined if zeroflag is true. If the answer is negative, control returns to step 904. If the answer is affirmative, at step 912 if calib=2. Calib=1 or 2 correspond to different testing modes as shown in FIG. 9. If the answer is affirmative, at step 914, it is determined if the upper peak is greater than the lower threshold and execution continues at step 916.

If the answer at step 912 is negative, at step 918, it is determined if MaxPeak is greater than the threshold.

If the answer at step 918 is affirmative, at step 920 it is determined if sel is less than the number of attenuation levels (e.g., number of AGC capacitors switched into the circuit). If the answer is negative, control returns to step 904. If the answer is affirmative, execution continues at step 922 where sel is set to sel+1 and execution returns to step 904.

If the answer at step 918 is negative, at step 924 it is determined if UpperPeak is greater than LowerThreshold. If the answer is negative, return to step 904. If affirmative, at step 926 a determination is made if sel==0. If answer is negative, return is made to step 904. If answer is affirmative, then sel=sel−1. Then, execution returns to step 904.

It will be appreciated that steps 914 and 916 are performed in calibration mode while the remaining steps are performed in normal operating mode.

Figure 10A:
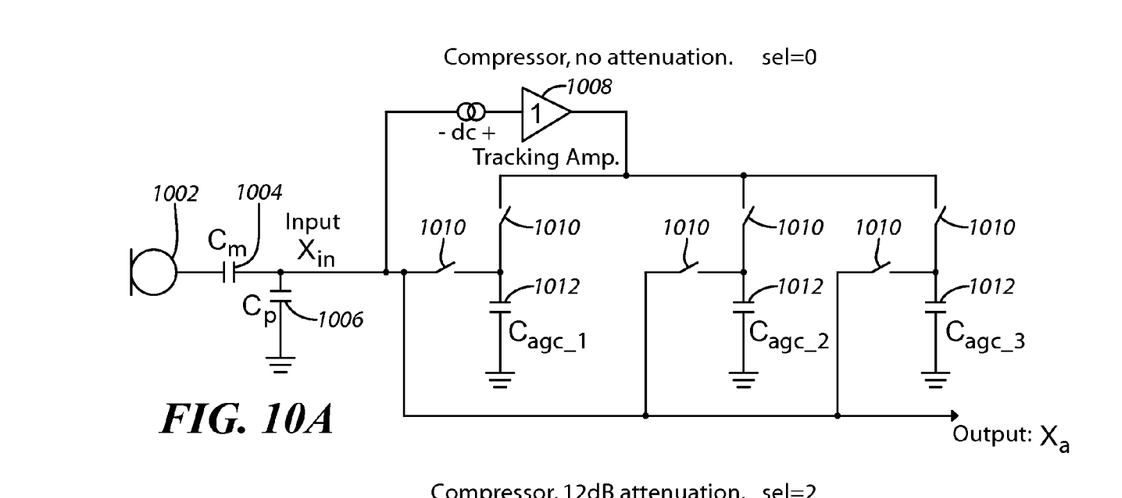
Figure 10B:
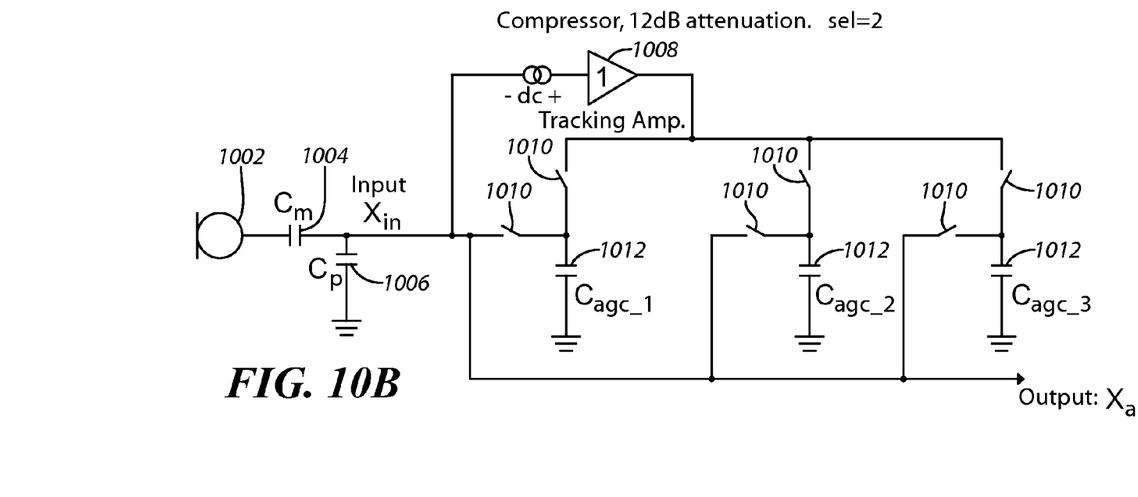

Referring now to FIGS. 10A and 10B, one example of a compressor used with a buffer is now described. A transducer 1002 couples to capacitors 1004 (Cagc 1, 2, and 3) and tracking amplifier 1008. Various switches 1010 are opened and closed to attenuate the incoming signal by including in the circuit various ones of AGC capacitors 1012.

The gain through from Xin to Xa is controlled by the 6 switches 1010 and the 3 AGC capacitors 1012. The attenuation is determined by the relation between the parasitic cap "Cp", the microphone cap "Cm" and the three AGC capacitors Cagc.

The compressor receives a sel signal from the gain control module and some of the capacitors are turned on and some are used for tracking:

|  | Sel = 0: | Sel = 1: | Sel = 2: | Sel = 3: |
| --- | --- | --- | --- | --- |
| Attenuation | 0 dB | 6 dB | 12 dB | 18 dB |
| Cagc turned on | none | Cagc no. 1 | Cagc no. 1 and 2 | Cagc no. 1, 2 and 3 |
| Cagc tracking | Cagc no. 1, 2 and 3 | Cagc no. 2 and 3. | Cagc no. 3 | None |

The gain through the compressor from Xin to Xa is controlled by the 6 switches 1010 and the 3 AGC capacitors 1012. Each capacitor 1012 is sequentially switched into the circuit meaning that when Sel=1 only the first AGC Cap Cagc1 is switched in and when Sel=3 all three AGC capacitors (Cagc1, 2, and 3) are all switched in.

In one aspect, the AGC capacitors 1012 are trimmed during testing in order to give the correct attenuation of 6, 12 and 18 dB. In another aspect, only trimming using Sel=1 is used since carefully matching and design will track the other two AGC capacitors.

Under normal operation the switches will be controlled by the gain control module as described elsewhere herein. But, during trimming the following registers/memory locations affect the compressor block and are controlled by the values of bufi_agc_trim (e.g., 5 bits) and force_agc_sel (3 bits).

Bufi_agc_trim changes the AGC capacitors to match the microphone capacitance in order to have 6 dB attenuation steps. Force_agc_sel bits force the compressor to select one of the 3 attenuations. During trimming the force_exp_sel are also set in order to force the expander to select a fixed gain.

The tracking amplifier 1008 precharges the capacitors 1012 when they not are switched in, i.e., provide no attenuation. In this way, there would be no distribution of charge between AGC capacitors 1012 and the MEMS capacitor when the device is in attack mode. This results in a continuous signal, without any momentary jumps, provided at the Xin node and thereby through the rest of the analogue signal chain in the circuit.

Preferred embodiments are described herein, including the best mode known to the inventors. It should be understood that the illustrated embodiments are exemplary only, and should not be taken as limiting the scope of the invention.

What is claimed is:

1. An apparatus comprising:
an input buffer configured to receive an input analog signal, the input buffer having a first adjustable gain and operating in the analog domain;
an analog-to-digital converter coupled to the input buffer, the analog-to-digital converter configured to convert the input analog signal received from the input buffer into digital data;
a decompress module coupled to the analog to digital converter, the decompress module configured to operate in the digital domain, the decompress module configured to decompress digital data received from the analog-to-digital converter, the decompress module having a second adjustable gain and producing an output digital signal;
a gain control module coupled to the input buffer and the decompress module, the gain control module configured to control the first gain of the input buffer in the analog domain and the second gain of the decompress module in the digital domain based on a signal metric.

2. The apparatus of claim 1, wherein as the first gain is increased, the second gain is decreased, and wherein when the first gain is decreased, the second gain is increased.

3. The apparatus of claim 1, wherein the gain control module is further configured to determine the signal metric by sampling data in the digital domain.

4. The apparatus of claim 3, wherein the gain control module is further configured to determine whether the signal metric exceeds a first pre-determined threshold.

5. The apparatus of claim 4, wherein in response to determining the signal metric exceeds the first pre-determined threshold, the gain control module is configured to decrease the first gain and increase the second gain.

6. The apparatus of claim 3, wherein the gain control module is further configured to determine whether the signal metric is below a second pre-determined threshold for a predetermined period of time.

7. The apparatus of claim 6, wherein in response to determining the signal metric is below the second pre-determined threshold for the predetermined period of time, the gain control module is configured to increase the first gain and decrease the second gain.

8. The apparatus of claim 1, further comprising an audio amplifier configured to amplify the input analog signal in the analog domain.

9. A method in an electrical circuit, the method comprising:
receiving an input analog signal at an input buffer, the input buffer having a first adjustable gain;
converting the input analog signal received from the input buffer into digital data; at a decompress module configured to operate in the digital domain, the decompress module having a second adjustable gain, decompressing the digital data and producing an output digital signal;
controlling the first gain of the input buffer and the second gain of the decompress module based on a signal metric,
wherein the gain of the decompress module is inversely related to the gain of the imput buffer.

10. The method of claim 9, wherein as the first gain is increased, the second gain is decreased, and wherein when the first gain is decreased, the second gain is increased.

11. The method of claim 9, further comprising controlling the first gain of the input buffer and the second gain of the decompress module based on a measure of the signal metric in the digital domain.

12. The method of claim 11, further comprising determining whether the signal metric exceeds a first pre-determined threshold.

13. The method of claim 12, further comprising, in response to determining the signal metric exceeds the first pre-determined threshold, decreasing the first gain and increasing the second gain.

14. The method of claim 11, further comprising determining whether the signal metric is below a second pre-determined threshold for a predetermined period of time.

15. The method of claim 14, further comprising, in response to determining the signal metric is below the second pre-determined threshold for the predetermined period of time, increasing the first gain and decreasing the second gain.

16. The method of claim 9, further comprising amplifying the input analog with an audio amplifier in the analog domain.

17. A microphone comprising:
a transducer structured to convert sound energy to an analog signal; and
an integrated circuit coupled to the transducer, the integrated circuit comprising:
an input buffer, the input buffer configured to receive the analog signal from the transducer, the input buffer having a first adjustable gain and operating in the analog domain;
an analog-to-digital converter coupled to the input buffer, the analog-to-digital converter configured to convert the analog signal into digital data;
a decompress module coupled to the analog to digital converter, the decompress module configured to operate in the digital domain, the decompress module configured to decompress the digital data, the decompress module having a second adjustable gain and producing an output digital signal; and
a gain control module coupled to the input buffer and the decompress module, the gain control module configured to inversely control the first gain of the input buffer in the analog domain and the second gain of the decompress module in the digital domain based on a signal metric.

18. The microphone of claim 17, wherein the transducer is a micro-electro-mechanical systems (MEMS) device comprising a diaphragm and a back plate.

19. The microphone of claim 17, wherein the gain control module is configured to obtain the signal metric from the digital domain.

20. The microphone of claim 17, wherein the gain control module is configured to decrease the second gain when the first gain is increased, and the gain control module is configured to decrease the first gain when the second gain is increased.

\* \* \* \* \*